United States Patent
Shin et al.

(10) Patent No.: US 9,653,652 B2
(45) Date of Patent: May 16, 2017

(54) FLEXIBLE DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Dong-Woo Shin, Yongin (KR); Youn-Sun Kim, Yongin (KR); Seul-Ong Kim, Yongin (KR); Jung-Sub Lee, Yongin (KR); Naoyuki Ito, Yongin (KR); Chang-Woong Chu, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 14 days.

(21) Appl. No.: 14/536,329

(22) Filed: Nov. 7, 2014

(65) Prior Publication Data

US 2015/0263235 A1 Sep. 17, 2015

(30) Foreign Application Priority Data

Mar. 17, 2014 (KR) ........................ 10-2014-0031162

(51) Int. Cl.
*H01L 27/32* (2006.01)
*H01L 51/50* (2006.01)
(Continued)

(52) U.S. Cl.
CPC ............ *H01L 33/38* (2013.01); *H01L 27/124* (2013.01); *H01L 27/127* (2013.01);
(Continued)

(58) Field of Classification Search
CPC ............... H01L 27/124; H01L 27/1248; H01L 27/1262; H01L 27/3258; H01L 27/326;
(Continued)

(56) References Cited

U.S. PATENT DOCUMENTS 563,959 A * 7/1896 Grothe .................... B62M 3/08
74/594.4
6,291,761 B1 * 9/2001 Takada .............. H01L 31/03529
136/244
(Continued)

FOREIGN PATENT DOCUMENTS

| JP | 4060125 | 12/2007 |
|---|---|---|
| KR | 10-2012-0037738 | 4/2012 |
| KR | 10-2012-0116813 | 10/2012 |

OTHER PUBLICATIONS

Moon, Jaehyun et al., "Spontaneously formed corrugation for OLED light extraction", IMID 2013 Digest, 2013, p. 54.
(Continued)

*Primary Examiner* — Marvin Payen
*Assistant Examiner* — Jeremy Joy
(74) *Attorney, Agent, or Firm* — Lewis Roca Rothgerber Christie LLP

(57) ABSTRACT

Provided is a flexible display apparatus having an improved light extracting efficiency and a method of manufacturing the flexible display apparatus. The flexible display apparatus includes a flexible substrate having a rippled surface, a pixel electrode on the flexible substrate and having a rippled surface, an intermediate layer on the pixel electrode and including a light emission layer, and an opposing electrode facing the pixel electrode. A method of manufacturing the flexible display apparatus includes applying a tensile force to a flexible substrate, forming a pixel electrode on the flexible substrate, removing the tensile force applied to the flexible substrate to form a rippled surface in the pixel electrode, forming an intermediate layer including an light emission layer on the pixel electrode, and forming an opposing electrode facing the pixel electrode.

8 Claims, 5 Drawing Sheets

(51) Int. Cl.
- *H01L 27/28* (2006.01)
- *H01L 51/56* (2006.01)
- *H01L 33/38* (2010.01)
- *H01L 27/12* (2006.01)
- *H01L 51/00* (2006.01)
- *H01L 51/52* (2006.01)

(52) U.S. Cl.
CPC ...... *H01L 27/1218* (2013.01); *H01L 27/1222* (2013.01); *H01L 27/1237* (2013.01); *H01L 27/1262* (2013.01); *H01L 27/1292* (2013.01); *H01L 27/3244* (2013.01); *H01L 27/3258* (2013.01); *H01L 51/0097* (2013.01); *H01L 51/52* (2013.01); *H01L 51/5209* (2013.01); *H01L 51/5262* (2013.01); *H01L 51/5268* (2013.01); *H01L 51/56* (2013.01); *H01L 27/3246* (2013.01); *H01L 27/3248* (2013.01); *H01L 2251/5338* (2013.01)

(58) Field of Classification Search
CPC ........ H01L 51/5203–51/5206; H01L 51/5209; H01L 51/5212; H01L 51/56; H01L 51/5268; H01L 51/0097; H01L 27/3244; H01L 27/3246; H01L 27/1222; H01L 27/1237; H01L 27/127
USPC .................................. 257/40, 88; 438/32, 34
See application file for complete search history.

(56) References Cited

U.S. PATENT DOCUMENTS

| | | | | |
|---|---|---|---|---|
| 6,872,980 | B2* | 3/2005 | Cheng | G02F 1/13378 257/40 |
| 7,692,740 | B2 | 4/2010 | Doi et al. | |
| 2002/0001046 | A1 | 1/2002 | Jacobsen et al. | |
| 2002/0084747 | A1* | 7/2002 | Fujieda | H01L 51/5206 313/506 |
| 2003/0180474 | A1* | 9/2003 | Nishikawa | C23C 14/042 427/468 |
| 2004/0017153 | A1* | 1/2004 | Nishikawa | H01L 27/3258 313/506 |
| 2004/0124469 | A1* | 7/2004 | Makita | H01L 27/12 257/347 |
| 2004/0140465 | A1* | 7/2004 | Kimura | H01L 51/5281 257/40 |
| 2004/0150761 | A1* | 8/2004 | Wong | G02F 1/136227 349/43 |
| 2005/0242364 | A1* | 11/2005 | Moustakas | B82Y 20/00 257/103 |
| 2005/0285509 | A1* | 12/2005 | Funamoto | H01L 51/5209 313/504 |
| 2006/0164742 | A1* | 7/2006 | Katagami | G02F 1/133516 359/895 |
| 2007/0096636 | A1* | 5/2007 | Park | H01L 27/3246 313/503 |
| 2010/0304048 | A1 | 12/2010 | Yukinobu et al. | |
| 2013/0264595 | A1* | 10/2013 | Hong | G02B 26/02 257/91 |
| 2014/0138642 | A1* | 5/2014 | Kim | H01L 27/3244 257/40 |
| 2014/0166993 | A1* | 6/2014 | Leu | H01L 51/5268 257/40 |
| 2014/0312352 | A1* | 10/2014 | Nakagawa | H01L 29/78675 257/72 |
| 2015/0097191 | A1* | 4/2015 | Chen | H01L 51/5209 257/72 |
| 2015/0188080 | A1* | 7/2015 | Choi | H01L 51/56 257/88 |

OTHER PUBLICATIONS

White, Matthew S. et al., "Ultrathin, highly flexible and stretchable PLEDs", Nature Photonics, Jul. 28, 2013, pp. 811-816, vol. 7.

* cited by examiner

FLEXIBLE DISPLAY APPARATUS AND METHOD OF MANUFACTURING THE SAME

CROSS-REFERENCE TO RELATED APPLICATION

This application claims priority to and the benefit of Korean Patent Application No. 10-2014-0031162, filed on Mar. 17, 2014, in the Korean Intellectual Property Office, the entire disclosure of which is incorporated herein by reference.

BACKGROUND

1. Field

Aspects of the present invention relate to a flexible display apparatus and a method of manufacturing the same.

2. Description of the Related Art

As interests in flexible display apparatuses have increased, research into these flexible display apparatuses has been more actively conducted. As a result, a flexible substrate formed of a material such as a resin instead of the more conventionally known glass substrate is now often implemented in these flexible display apparatuses.

However, in flexible display apparatuses according to the conventional art, a portion of light emitted from a display unit of these flexible display apparatuses is confined in the display apparatus, and, thus, a light extracting efficiency is decreased.

SUMMARY

Aspects of the present invention are directed toward a flexible display apparatus having improved light extracting efficiency, and a method of manufacturing the flexible display apparatus having improved light extracting efficiency.

Additional aspects of the present invention will be set forth in part in the description which follows, and, in part, will be apparent from the description, or may be learned by practice of the presented embodiments.

According to one or more embodiments of the present invention, a flexible display apparatus includes a flexible substrate having a rippled surface, a pixel electrode on the flexible substrate and having a rippled surface, an intermediate layer on the pixel electrode and including a light emission layer, and an opposing electrode facing the pixel electrode.

The rippled surface of the pixel electrode may include irregularly spaced ripples.

The flexible substrate may include an elastic material.

The flexible substrate may include a first area including a thin film transistor, and a second area including the pixel electrode. The pixel electrode may be coupled to the thin film transistor.

According to one or more embodiments of the present invention, a method of manufacturing a flexible display apparatus includes applying a tensile force to a flexible substrate, forming a pixel electrode on the flexible substrate, removing the tensile force applied to the flexible substrate to form a rippled surface in the pixel electrode, forming an intermediate layer including an light emission layer on the pixel electrode, and forming an opposing electrode facing the pixel electrode.

The removing of the tensile force may include forming irregularly spaced ripples in the pixel electrode.

The flexible substrate may include an elastic material.

The forming of the intermediate layer including the light emission layer may include using a deposition method or a printing method.

According to one or more embodiments of the present invention, a method of manufacturing a flexible display apparatus includes applying a tensile force to a flexible substrate, forming a pixel electrode on the flexible substrate, forming an intermediate layer including a light emission layer on the pixel electrode, forming an opposing electrode facing the pixel electrode, and removing the tensile force applied to the flexible substrate to form a rippled surface in the pixel electrode.

The removing of the tensile force may include forming irregularly spaced ripples in the pixel electrode.

The flexible substrate may include an elastic material.

The forming of the intermediate layer including the light emission layer may include using a deposition method or a printing method.

BRIEF DESCRIPTION OF THE DRAWINGS

These and/or other aspects of the invention will become apparent and more readily appreciated from the following description of the embodiments, taken in conjunction with the accompanying drawings, in which.

DETAILED DESCRIPTION

Figure 1:
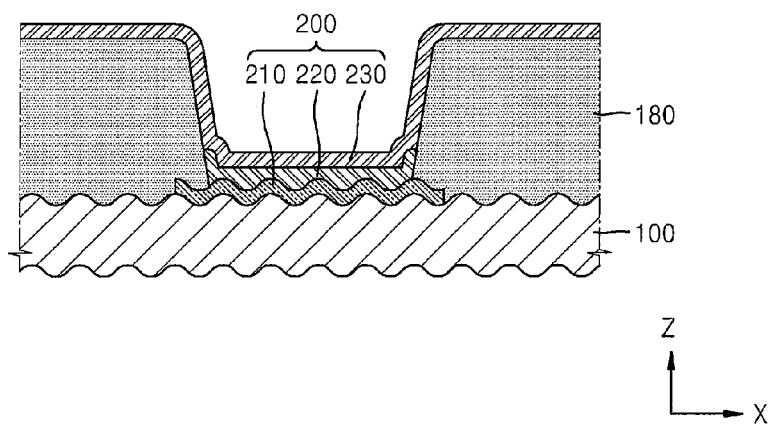
FIG. 1 is a schematic cross-sectional view of a flexible display apparatus according to an embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Since the present invention may have various modifications and several embodiments, example embodiments are shown in the drawings and will be described in detail. Advantages, features, and methods of achieving the same will be specified with reference to the embodiments described below in detail and together with the attached drawings. However, the embodiments may have different forms and should not be construed as being limited to the descriptions set forth herein.

The embodiments of the present invention will be described below in more detail with reference to the accompanying drawings. Those components that are the same or are in correspondence are rendered the same reference numeral regardless of the figure number, and redundant explanations are omitted.

It will be understood that although the terms "first," "second," etc. may be used herein to describe various components, these components should not be limited by these terms. These components are only used to distinguish one component from another. Singular expressions, unless defined otherwise in contexts, include plural expressions.

In the embodiments below, it will be further understood that the terms "comprise" and/or "have" used herein specify the presence of stated features or components, but do not preclude the presence or addition of one or more other features or components. Also, it will be understood when a portion such as a layer, an area, or an element is referred to as being "on" or "above" another portion, it can be directly on or above the other portion, or an intervening portion may also be present.

Also, in the drawings, for convenience of description, sizes of elements may be exaggerated or contracted. In other words, since sizes and thicknesses of components in the drawings are arbitrarily illustrated for convenience of explanation, the following embodiments are not limited thereto.

In the embodiments below, an x-axis, a y-axis, and a z-axis are not limited to three axes on a rectangular coordinate system, but may be construed as including these axes. For example, an −x axis, a y-axis, and a z-axis may be at right angles or not, and may also indicate different directions from one another, which are not necessarily at right angles.

When an embodiment is implementable in another manner, a predetermined or set process order may be different from a described one. For example, two processes that are consecutively described may be substantially simultaneously performed or may be performed in an opposite order to the described order.

FIG. 1 is a schematic cross-sectional view of a flexible display apparatus according to an embodiment of the present invention.

Referring to the embodiment illustrated in FIG. 1, a flexible display apparatus includes a flexible substrate 100, a pixel electrode 210 on the flexible substrate 100, an intermediate layer 220 including a light emission layer, and an opposing electrode 230.

The flexible substrate 100 may be formed of a polymer material such as a plastic film having bendable characteristics. The flexible substrate 100 may include a polymer material such as polyimide (PI), polycarbonate (PC), polyethersulfone (PES), polyethylene terephthalate (PET), polyethylene naphthalate (PEN), polyarylate (PAR), or a fiber glass reinforced plastic (FRP). The flexible substrate 100 may be elastic.

The flexible substrate 100 may have a wrinkled structure or rippled surface as shown in FIG. 1. While the wrinkled structure or rippled surface of the flexible substrate 100 is illustrated in the embodiment shown in FIG. 1 as having wrinkles or ripples at regular intervals, the wrinkled structure or rippled surface of the flexible substrate 100 may also have wrinkles or ripples at irregular intervals, according to other embodiments. A diameter or length of the wrinkles or ripples of the wrinkled structure or rippled surface of the flexible substrate 100 may vary in size from approximately dozens to approximately tens of micrometers.

The flexible substrate 100, according to the embodiment described above, is formed of a material including an elastic polymer material such that if a tensile force is applied to and then removed from the flexible substrate 100, the wrinkled structure or ripped surface may be formed. The wrinkled structure or ripped surface of the flexible substrate 100, in this embodiment, is formed by mechanical or physical deformation of the flexible substrate 100, rather than by use of a chemical patterning having a set or predetermined shape, and, thus, may be formed at irregular intervals. According to some embodiments, to form the wrinkled structure or rippled surface in the flexible substrate 100, the flexible substrate 100 may be further contracted after the tensile force is removed.

In an embodiment, an organic light emitting device 200 may be on the flexible substrate 100. The organic light emitting device 200 may include the pixel electrode 210, the intermediate layer 220 including a light emission layer, and the opposing electrode 230.

The pixel electrode 210 may be on the flexible substrate 100. In this embodiment, the pixel electrode 210 may be directly on the flexible substrate 100, or according to an embodiment in which various layers are on the flexible substrate 100, the pixel electrode 210 may be on the layers on the flexible substrate 100. For example, in this embodiment, a thin film transistor (TFT) may be on the flexible substrate 100, a planarization layer may extend over the TFT, and the pixel electrode 210 may be on the planarization layer. However, the embodiments of the present invention are not limited to top emission, as described above, and may also apply to bottom emission. Hereinafter, for convenience of description, the pixel electrode 210 is illustrated and described as being directly on the flexible substrate 100, though variations may exist.

The pixel electrode 210 may have a wrinkled structure or rippled surface, according to an embodiment. In this embodiment, the pixel electrode 210 may be on the flexible substrate 100 and may correspond with or complement the wrinkled structure or rippled surface of the flexible substrate 100. In FIG. 1, for convenience, the wrinkled structure or rippled surface of the pixel electrode 210 is illustrated as having wrinkles or ripples that are at regular intervals corresponding to the wrinkled structure or rippled surface of the flexible substrate 100. However, the wrinkled structure or rippled surface of the pixel electrode 210 may also have wrinkles or ripples that are at irregular intervals. The wrinkled structure or rippled surface of the pixel electrode 210 may be formed according to the wrinkled structure or rippled surface of the flexible substrate 100 below the pixel electrode 210 without any change or variance, or, according to an embodiment, some of the wrinkled structure or rippled surface of the pixel electrode 210 may vary from the wrinkled structure or rippled surface of the flexible substrate 100.

The pixel electrode 210 may be formed of a (semi) transparent electrode or a reflective electrode. In an embodiment where the pixel electrode 210 is formed of a (semi) transparent electrode, the pixel electrode 210 may be formed of, for example, ITO, IZO, ZnO, $In_2O_3$, IGO, or AZO. In an embodiment where the pixel electrode 210 is formed of a reflective electrode, the pixel electrode 210 may include a reflective layer formed of Ag, Mg, Al, Pt, Pd, Au, Ni, Nd, Ir, or Cr, and a layer formed of ITO, IZO, ZnO, $In_2O_3$, IGO, or AZO. However, the pixel electrode 210 is not limited to these embodiments, and may be formed of various materials, and may also include various structures such as a single layer structure or a multi-layer structure.

In an embodiment, a pixel defining layer 180 may be on the flexible substrate 100. The pixel defining layer 180 may extend over an edge of the pixel electrode 210 such that a center portion of the pixel electrode 210 is exposed, according to an embodiment. The center portion of the pixel electrode 210 exposed by the pixel defining layer 180, in this embodiment, may be a pixel area of a display unit.

The pixel defining layer 180 may be formed of, for example, an organic insulating layer. The organic insulating layer may be, for example, an acrylic polymer such as a poly(methyl acrylate) (PMMA), a polystyrene (PS), a polymer derivative having a phenol group, an imide based polymer, an aryl ether based polymer, an amide based polymer, a fluorine based polymer, a p-xylene based polymer, a vinyl alcohol based polymer, and/or a mixture of these.

In an embodiment, the intermediate layer 220 including a light emission layer may be on the pixel electrode 210 that is exposed by the pixel defining layer 180. While the intermediate layer 220 is shown as a single layer in FIG. 1, the intermediate layer 220, according to other embodiments, may include an emission layer (EML), and may have a single layer structure or a multi-layer structure in which, in addition to the EML, a hole injection layer (HIL), a hole transport layer (HTL), an electron transport layer (ETL), and/or an electron injection layer (EIL) are stacked or included. However, the intermediate layer 220 is not limited to these embodiments, and may also have other various structures.

Referring to the embodiment shown in FIG. 1, a lower surface of the intermediate layer 220 facing or closest to the flexible substrate 100 may have a structure or surface corresponding with or complementing the wrinkled structure or rippled surface of the pixel electrode 210, and an upper surface of the intermediate layer 220 facing away from or further away from the flexible substrate 100 may have a relatively flat structure or surface, according to an embodiment. However, the shape of the intermediate layer 220 is not limited to these embodiments, and, according to a method of forming the intermediate layer 220, the upper surface of the intermediate layer 220 facing away from the flexible substrate 100 may also be wrinkled or rippled corresponding with the structure or surface of the flexible substrate 100.

The intermediate layer 220 may be formed of a low-molecular organic material or a polymer organic material, according to an embodiment.

In an embodiment where the intermediate layer 220 is formed of a low-molecular organic material, layers including an HTL, an HIL, an ETL, and/or an EIL, or the like, may be stacked around, for example, an EML. In addition, other layers may also be stacked in the intermediate layer 220, according to an embodiment. Examples of an organic material that may be included in the intermediate layer 220 include copper phthalocyanine (CuPC), N'-di(naphthalene-1-yl)-N, N'-diphenyl-benzidine (NPB), and tris-8-hydroxy-quinoline aluminum (Alq3).

In an embodiment where the intermediate layer 220 is a polymer organic material, for example, layers including an HTL may be included in addition to an EML. The HTL may be, for example, poly-(2,4)-ethylene-dihydroxy thiophene (PEDOT) or polyaniline (PANI). Examples of an organic material that may be used include polyphenylene vinylene (PPV)-based polymer organic materials and polyfluorene-based polymer organic materials. In an embodiment, an inorganic material may be included between the intermediate layer 220 and the pixel electrode 210 and/or the opposing electrode 230.

In an embodiment, the HTL, the HIL, the ETL, and the EIL may be integrally formed over the entire surface of the flexible substrate 100, and the EML may be formed in each pixel, for example, using an inkjet printing operation.

In an embodiment, the opposing electrode 230 may be on the intermediate layer 220. The opposing electrode 230, in an embodiment, may be integrally formed with the flexible substrate 100 to face the pixel electrode 210. The opposing electrode 230 may be formed of a transparent electrode, a semitransparent electrode, or a reflective electrode.

In an embodiment where the opposing electrode 230 is formed of a (semi) transparent electrode, the opposing electrode 230 may include a layer formed of a metal having a small work function, for example, Li, Ca, LiF/Ca, LiF/Al, Al, Ag, Mg, or a compound thereof, and a (semi) transparent conductive layer such as ITO, IZO, ZnO, or $In_2O_3$. In an embodiment where the opposing electrode 230 is formed of a reflective electrode, the opposing electrode 230 may include a layer formed of Li, Ca, LiF/Ca, LiF/Al, Al, Ag, Mg, or a compound thereof. However, the structure and materials of the opposing electrode 230 are not limited to these embodiments, and may be modified in various manners.

Figure 2:
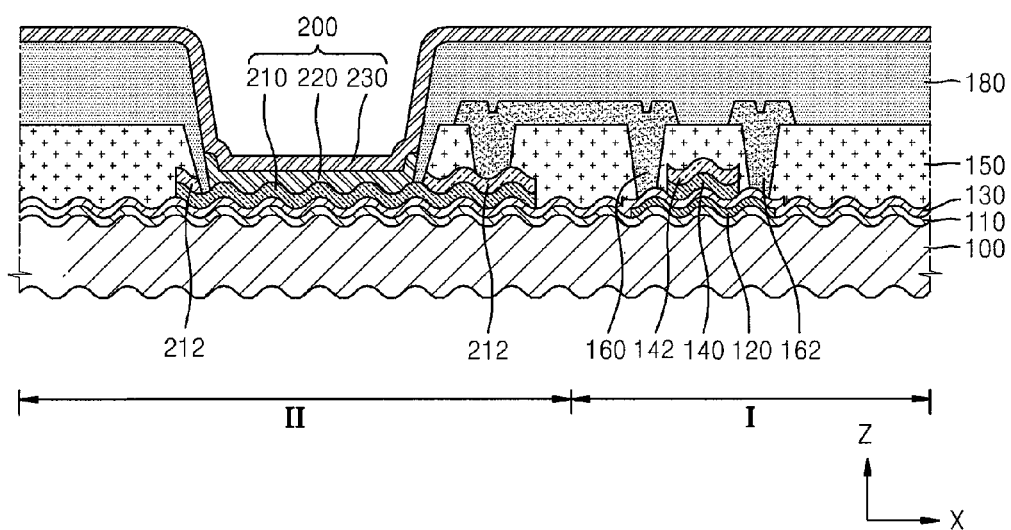
FIG. 2 is a schematic cross-sectional view of a flexible display apparatus according to an embodiment of the present invention.

FIG. 2 is a schematic cross-sectional view of a flexible display apparatus according to another embodiment of the present invention. In this embodiment, a bottom emission type flexible display apparatus is illustrated in FIG. 2.

Referring to the embodiment illustrated in FIG. 2, a flexible display apparatus according to this embodiment includes a flexible substrate 100, a pixel electrode 210 on the flexible substrate 100, an intermediate layer 220 including a light emission layer, and an opposing electrode 230.

The flexible substrate 100 may be formed of a polymer material such as a plastic film having bendable characteristics. The flexible substrate 100, in an embodiment, may be elastic.

The flexible substrate 100 may have a first area I and a second area II. As illustrated in FIG. 2, the first area I of the flexible substrate 100 may include a TFT, and the second area II of the flexible substrate 100 may include the pixel electrode 210. Accordingly, in the flexible display apparatus of the current embodiment, an organic light emitting device 200 may be in the second area II of the flexible substrate 100.

As illustrated in FIG. 2, the flexible substrate 100 may have a wrinkled structure or rippled surface. As shown in the embodiment illustrated in FIG. 2, the wrinkled structure or rippled surface of the flexible substrate 100 may have wrinkles or ripples at regular intervals, but the wrinkled structure or rippled surface of the flexible substrate 100 may also have wrinkles at irregular intervals. A diameter or length of wrinkles or ripples of the wrinkled structure or rippled surface of the flexible substrate 100 may vary in size from approximately dozens to approximately tens of micrometers.

The flexible substrate 100, according to the embodiment described above, is formed of a material including an elastic polymer material such that if a tensile force is applied to and then removed from the flexible substrate 100, the wrinkled structure or rippled surface may be formed. The wrinkled structure or rippled surface of the flexible substrate 100, in this embodiment, is formed by mechanical and physical deformation of the flexible substrate 100, rather than by use of a chemical patterning having a set or predetermined shape, and, thus, may be have wrinkles or ripples formed at irregular intervals. According to some embodiments, to form the wrinkled structure or rippled surface in the flexible substrate 100, the flexible substrate 100 may be further contracted after removing the tensile force.

A buffer layer 110 may extend over the entire surface of the flexible substrate 100 to planarize the surface of the flexible substrate 100 or to prevent penetration of impurity elements into a semiconductor layer 120 that may be on the buffer layer 110. The buffer layer 110 may be directly on the flexible substrate 100, and thus, may have a wrinkled structures or rippled surface corresponding with or complementing the wrinkles or ripples of the flexible substrate 100. While the wrinkled structure or rippled surface shown in FIG. 2 is illustrated as having wrinkles or ripples that are at regular intervals, the wrinkled structure or rippled surface may also have wrinkles or ripples at irregular intervals, as described above. The buffer layer 110 may be formed of, for example, a silicon oxide ($SiO_2$) or silicon nitride (SiNx) material.

The semiconductor layer 120, in an embodiment, is patterned, and may be on the buffer layer 110. The semiconductor layer 120 may be in the first area I of the flexible substrate 100. While the semiconductor layer 120 may have a wrinkled structure or rippled surface corresponding with or complementing the buffer layer 110 on the flexible substrate 100, the shape of the semiconductor layer 120 is not limited thereto, and the semiconductor layer 120 may have a different structure, surface, or shape, for example, the semiconductor layer 120 may also have a flat shape. The semiconductor layer 120, according to an embodiment, may be an amorphous silicon or a crystalline polysilicon.

The buffer layer 110 and the semiconductor layer 120 may be deposited using various deposition methods, including, for example, a plasma enhanced chemical vapor deposition (PECVD) method, an atmospheric pressure CVD (APCVD) method, or a low pressure CVD (LPCVD) method.

In an embodiment, in order for the semiconductor layer 120 to provide insulation characteristics with respect to a first gate electrode 140 (described in greater detail below), a gate insulation layer 130 formed of a silicon oxide, and/or a silicon nitride, or the like, may be interposed between the semiconductor layer 120 and the first gate electrode 140 extending over the entire surface of the flexible substrate 100. The gate insulation layer 130 may have a wrinkled structure or rippled surface. The gate insulation layer 130 is shown in FIG. 2 with a wrinkled structure or rippled surface having uniform wrinkles or ripples for convenience, but is not limited to this embodiment, and may also have wrinkles or ripples at irregular intervals.

In an embodiment, the first gate electrode 140 and a second gate electrode 142 are sequentially positioned on the semiconductor layer 120, with a source electrode 162 and a drain electrode 160 operated electrically according to a signal applied to the first and second gate electrodes 140 and 142. The first gate electrode 140 and the second gate electrode 142, in an embodiment, are patterned using the same mask operation, and, thus, may have the same etching surfaces. The first gate electrode 140 and the second gate electrode 142 are also shown in FIG. 2 as having a wrinkled structure or rippled surface, but are not limited to this embodiment and may also have flat shapes or surfaces, according to other embodiments.

The first gate electrode 140 in the first area I of the flexible substrate 100 may be on the same layer as the pixel electrode 210 in the second area II of the flexible substrate 100. Accordingly, the first gate electrode 140 may be formed of the same material as that of the pixel electrode 210.

As illustrated in FIG. 2, the pixel electrode 210 in the second area II of the flexible substrate 100 may have a wrinkled structure or rippled surface corresponding with or complementing the flexible substrate 100. Although the wrinkled structure or rippled surface of the pixel electrode 210 is also illustrated as having wrinkles or ripples at regular intervals corresponding with or complementing the wrinkled structure of the flexible substrate 100, the pixel electrode 210 may also have wrinkles or ripples at irregular intervals. The wrinkled structure or rippled surface of the pixel electrode 210 may correspond with or complement the wrinkled structure or rippled surface of the flexible substrate 100 below the pixel electrode 210, or may partially vary in this pattern from the wrinkled structure or rippled surface of the flexible substrate 100.

In this embodiment, the first gate electrode 140 and the pixel electrode 210 may include, for example, at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The second gate electrode 142 may be on the first gate electrode 140. The second gate electrode 142 on the flexible substrate 100 in the first area I may be on the same level as a metal layer 212 on the flexible substrate 100 in the second area II.

The metal layer 212 may be on the pixel electrode 210, and may be patterned such that a central portion of the pixel electrode 210 is exposed. Accordingly, the metal layer 212 may be at a boundary portion of the pixel electrode 210. The metal layer 212, according to an embodiment, brings a drain electrode of the TFT and the pixel electrode 210 into contact to be electrically connected or coupled.

Due to the adhesion properties with respect to adjacent layers, the surface planarization of stacked layers, and processibility, the second gate electrode 142 may include, for example, at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu).

In an embodiment, an interlayer insulation layer 150 may be on the first gate electrode 140 and the second gate electrode 142 and may be formed of a silicon oxide ($SiO_2$) or a silicon nitride ($SiN_x$) in a single layer structure or a multilayer structure.

The source electrode 162 and the drain electrode 160, according to an embodiment, are on the interlayer insulation layer 150. The source electrode 162 and the drain electrode 160, in this embodiment, are each electrically connected or coupled to the semiconductor layer 120 through contact openings defined in the interlayer insulation layer 150 and the gate insulation layer 130. The source electrode 162 and the drain electrode 160 may be formed, due to conductivity or the like, of at least one material selected from the group consisting of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu) in a single layer structure or a multilayer structure.

The drain electrode 160, according to an embodiment, is electrically connected or coupled to the metal layer 212 through an opening defined in the interlayer insulation layer 150. The metal layer 212 connected to the drain electrode 160, in this embodiment, electrically connects or couples the TFT and the pixel electrode 210. While an upper surface of the interlayer insulation layer 150 near the opposing electrode 230 (e.g., in the +z direction) is illustrated in FIG. 2 as being flat, the upper surface is not limited thereto, and at least a portion of the upper surface of the interlayer insulation layer 150 may be wrinkled or rippled to correspond with or complement the wrinkled structure or rippled surface of the flexible substrate 100 below the interlayer insulation layer 150.

In order to protect the TFT having the above-described structure, an insulation layer extending over the TFT may be further included as a protection layer, in an embodiment. The insulation layer may be formed of an inorganic material such as a silicon oxide, a silicon nitride, or a silicon oxynitride. The insulation layer may be modified in various manners; for example, the insulation layer may have a single layer structure or a multilayer structure.

In an embodiment, a pixel defining layer 180 may be on the TFT or on the above-described insulation layer. The pixel defining layer 180 may have an opening in the flexible substrate 100 in the second area II defining a pixel area through the opening.

While the upper surface of the pixel defining layer 180 toward the opposing electrode 230 (e.g., in the +z direction) is illustrated in FIG. 2 as being flat, according to some embodiments, at least a portion of the upper surface of the pixel defining layer 180 may have a wrinkled structure or rippled surface corresponding with or complementing the wrinkled structure or rippled surface of the flexible substrate 100 below the pixel defining layer 180.

In an embodiment, the pixel defining layer 180 may be formed of, for example, an organic insulation layer. Examples of the organic insulation layer include an acrylic polymer such as poly(methyl acrylate (PMMA), a polystyrene (PS), a polymer derivative having a phenol group, an imide based polymer, an aryl ether polymer, an amide based polymer, a fluorine based polymer, a p-xylene polymer, a vinyl alcohol based polymer, and/or a mixture of these.

In an embodiment, the opening of the pixel defining layer 180 defined in the flexible substrate 100 in the second area II defines a pixel area and may expose a central portion of the pixel electrode 210. The intermediate layer 220 including a light emission layer may be on the pixel electrode 210.

In the embodiment illustrated in FIG. 2, a lower surface of the intermediate layer 220 toward the flexible substrate 100 is along the wrinkled structure of the pixel electrode 210, and an upper surface of the intermediate layer 220 in an opposite direction away from the flexible substrate 100 is flat. However, the shape of the intermediate layer 220 is not limited thereto, and according to a method of forming the intermediate layer 220, the upper surface of the intermediate layer 220 in a direction away from the flexible substrate 100 may also be formed to correspond with or complement the wrinkled structure or rippled surface of the flexible substrate 100.

A detailed structure of the intermediate layer 220 and materials of the intermediate layer 220, according to an embodiment, are the same as those described above and, thus, descriptions thereof will not be repeated.

In an embodiment, the opposing electrode 230 that extends over the intermediate layer 220 including the light emission layer and faces the pixel electrode 210 may extend over the entire surface of the flexible substrate 100. The opposing electrode 230 may be formed of a (semi) transparent electrode or a reflective electrode.

Although in FIG. 2 the opposing electrode 230 is shown to be flat corresponding to the upper surface of the pixel defining layer 180 toward the opposing electrode 230, the shape or surface of the opposing electrode 230 is not limited thereto. According to other embodiments, at least a portion of the opposing electrode 230 may correspond with or complement the wrinkled structure of the flexible substrate 100.

Materials of the opposing electrode 230, according to an embodiment, are the same as described above, and, thus, descriptions thereof will not be repeated.

As described above, in an embodiment where a wrinkled structure or rippled surface is formed in the flexible substrate 100 of a flexible display apparatus, and the pixel electrode 210 on the flexible substrate 100 also has a wrinkled structure or rippled surface corresponding with or complementing the flexible substrate 100, a light extracting efficiency of the flexible display apparatus may be significantly increased.

The description above is focused on a flexible display apparatus, but the embodiments of the present invention are not limited thereto. For example, a method of manufacturing the flexible display apparatus described above is also included in the scope of the present disclosure.

FIGS. 3 through 6 are cross-sectional views illustrating a method of manufacturing a flexible display apparatus according to an embodiment of the present invention. Hereinafter, descriptions of the materials of the flexible display apparatus which are the same as those described above, will not be repeated.

Figure 3:
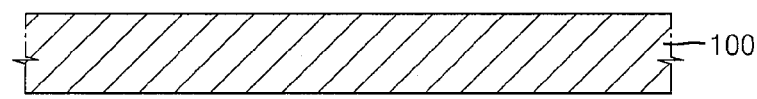
FIGS. 3 through 6 are cross-sectional views illustrating a method of manufacturing a flexible display apparatus according to an embodiment of the present invention.
Figure 3:
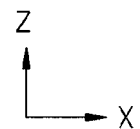

Referring to the method illustrated in FIG. 3, according to an embodiment, a flexible substrate 100 is prepared. The flexible substrate 100 may be formed of a polymer material such as a plastic film which has bendable characteristics. Accordingly, the flexible substrate 100, in an embodiment, may be elastic.

Figure 4:
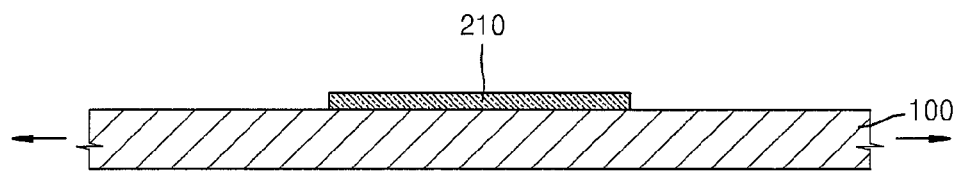
Figure 4:
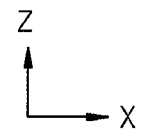

Referring to the method illustrated in FIG. 4, in this embodiment, a tensile force may be applied to the elastic flexible substrate 100. In the method illustrated in the embodiment shown in FIG. 4, the tensile force may be applied to the flexible substrate 100 by pulling the flexible substrate 100 simultaneously in, e.g., a +x direction and a −x direction which is opposite to the +x direction.

As described above, the pixel electrode 210 may be formed or positioned on the flexible substrate 100 while the tensile force is being applied to the flexible substrate 100. In FIG. 2, the pixel electrode 210 is illustrated as being formed or placed directly on the flexible substrate 100 for convenience, however, the embodiments of the present invention are not limited thereto. Thus, various other layers may be placed between the pixel electrode 210 and the flexible substrate 100.

For example, in an embodiment, the TFT may be on the flexible substrate 100, a planarization layer may be on the TFT, and the pixel electrode 210 may be on the planarization layer. However, the embodiments of the present invention are not limited to top emission and may also include bottom emission. Hereinafter, for convenience, the pixel electrode 210 is illustrated and described as being directly on the flexible substrate 100.

Figure 5:
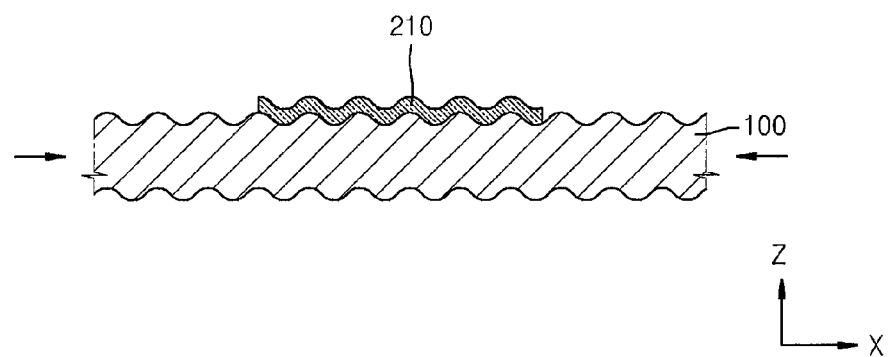

Next, referring to the embodiment illustrated in FIG. 5, the tensile force applied to the flexible substrate 100, e.g., in an x-axis direction or a y-axis direction, may be removed or no longer applied. The flexible substrate 100, which is then no longer under tensile force, may contract in a direction away from the direction in which the tensile force was applied, according to an embodiment. The arrows in the embodiment shown in FIG. 5 illustrates the contraction of the flexible substrate 100, to which the tensile force had been applied in the +x direction and the −x direction, in a direction opposite to the +x direction in a −x direction and a +x direction.

In this embodiment, a wrinkled structure or rippled surface is formed in the flexible substrate 100 after the tensile force is removed, and the pixel electrode 210 is formed on the flexible substrate 100. In FIG. 5, for convenience, the wrinkled structures or rippled surfaces in the flexible substrate 100 and the pixel electrode 210 are illustrated as having wrinkles or ripples at regular intervals, but the wrinkled structure or rippled surface of the flexible substrate 100 may also have wrinkles or ripples at substantially irregular intervals.

The wrinkles or ripples of the wrinkled structures or rippled surfaces of the flexible substrate 100 and the pixel electrode 210, according to an embodiment, may be at irregular intervals because the wrinkled structures or rippled surfaces are formed through mechanical or physical deformation of the flexible substrate 100 rather than using chemical patterning. In an embodiment where the flexible substrate 100 is formed of an elastic polymer material, the wrinkled structure or rippled surface may be created by applying a tensile force to the flexible substrate 100 and then removing the tensile force. In order to further form or define the wrinkled structure or rippled surface in the flexible substrate 100, an operation of contracting the flexible substrate 100 may also be applied after removing the tensile force applied to the flexible substrate 100. In this embodiment, where the wrinkled structure or rippled surface may be formed in the flexible substrate 100 and the pixel electrode 210 by using physical and mechanical methods, an additional mask or an additional patterning operation is not required, and, thus, the manufacturing process may be simplified.

Figure 6:
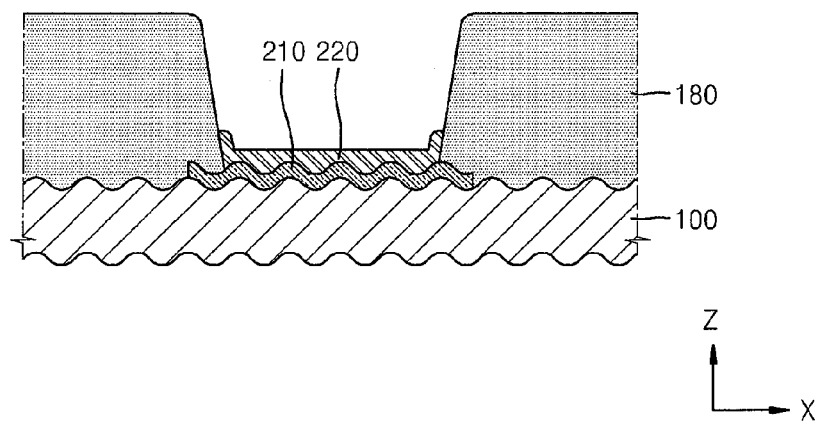

Next, referring to the embodiment illustrated in FIG. 6, a pixel defining layer 180 may be formed on the flexible substrate 100 having the wrinkled structure or rippled surface. An opening may be defined in the pixel defining layer 180 such that a central portion of the pixel electrode 210 where the wrinkled structure or rippled surface is formed is exposed. The opening portion of the pixel defining layer 180, in this embodiment, defines a pixel area.

In an embodiment, an intermediate layer 220 including a light emission layer may be in the pixel area defined by the pixel defining layer 180. The intermediate layer 220 may be on the pixel electrode 210 in which the wrinkled structure or rippled surface is formed.

The intermediate layer 220 may be formed by using, for example, an inkjet printing method or a deposition method. In the embodiment illustrated in FIG. 6, the intermediate layer 220 is formed using a solution method such as an inkjet printing method such that a lower surface of the intermediate layer 220 toward the flexible substrate 100 is formed along the wrinkled structure or rippled surface of the pixel electrode 210, and an upper surface of the intermediate layer 220 in an opposite direction, away from the flexible substrate 100, may be flat.

In an embodiment, the intermediate layer 220 may also be formed using a deposition method as described above. In this embodiment, both the upper and lower surfaces of the intermediate layer 220 may be formed to correspond with or complement the wrinkled structure or rippled surface of the pixel electrode 210.

In an embodiment, the opposing electrode 230 facing the pixel electrode 210 may be on the flexible substrate 100. The opposing electrode 230 may extend over the intermediate layer 220, and may extend over the entire surface of the flexible substrate 100.

According to the method of manufacturing a flexible display apparatus as described above, wrinkled structures or rippled surfaces may be physically and mechanically formed in the flexible substrate 100 and the pixel electrode 210 on the flexible substrate 100 without using an additional mask or patterning operation, and, thus, the manufacturing process may be simplified. Also, a light extracting efficiency of the flexible display apparatus may be significantly increased by using the wrinkled structure or rippled surface of the pixel electrode 210.

Figure 7:
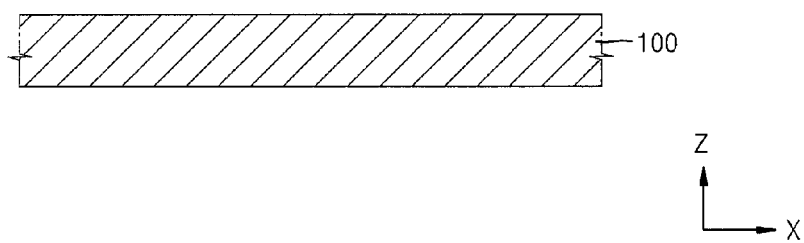
FIGS. 7 through 9 are cross-sectional views illustrating a method of manufacturing a flexible display apparatus according to an embodiment of the present invention.
Figure 8:
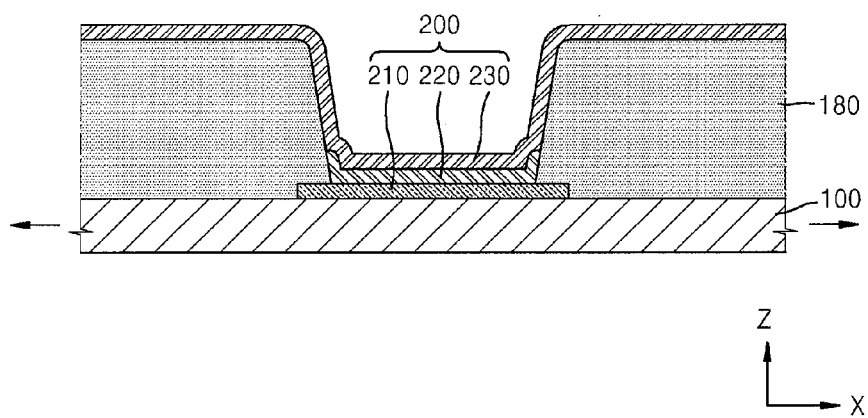
Figure 9:
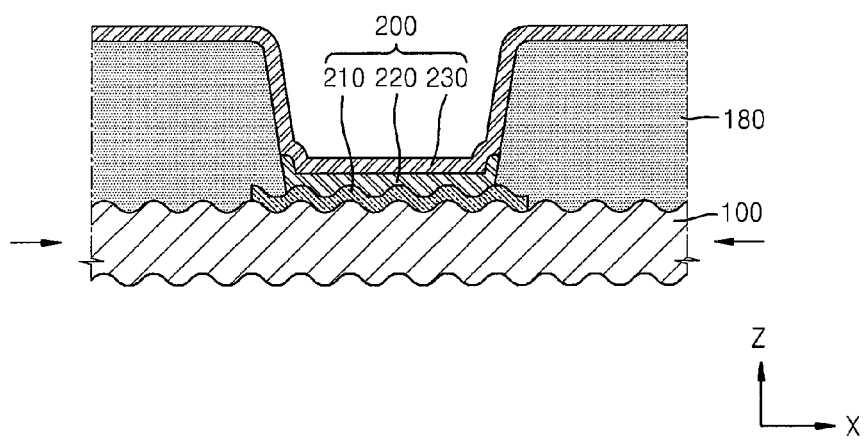

FIGS. 7 through 9 are cross-sectional views illustrating a method of manufacturing a flexible display apparatus according to another embodiment of the present invention.

Referring to the embodiment illustrated in FIG. 7, a method of manufacturing a flexible display apparatus includes preparing the flexible substrate 100. The flexible substrate 100 may be formed of a polymer material such as a plastic film having bendable characteristics. Accordingly, the flexible substrate 100, in an embodiment, may be elastic.

Next, referring to the method illustrated in FIG. 8, in this embodiment, a tensile force may be applied to the elastic flexible substrate 100. In the method illustrated in the embodiment shown in FIG. 8, the tensile force may be applied to the flexible substrate 100 by simultaneously pulsing the flexible substrate 100, for example, in a +x direction and a −x direction opposite to the +x direction.

The pixel electrode 210, according to this embodiment, may be formed or positioned on the flexible substrate 100 while the tensile force is applied to the flexible substrate 100, as described above. In FIG. 8, the pixel electrode 210 is illustrated as being formed or placed directly on the flexible substrate 100 for convenience, however, the embodiments of the present invention are not limited thereto. Thus, various other layers may be placed between the pixel electrode 210 and the flexible substrate 100.

For example, in an embodiment, the TFT may be on the flexible substrate 100, a planarization layer may cover the TFT, and the pixel electrode 210 may be on the planarization layer. However, the embodiments of the present invention are not limited to top emission, and may also include bottom emission. Hereinafter, for convenience, the pixel electrode 210 is illustrated and described as being directly on the flexible substrate 100.

Next, referring to the embodiment illustrated in FIG. 8, a pixel defining layer 180 may be formed on the flexible substrate 100 having the wrinkled structure or rippled surface. An opening may be defined in the pixel defining layer 180 such that a central portion of the pixel electrode 210 having the wrinkled structure or rippled surface is exposed. The opening of the pixel defining layer 180, in this embodiment, defines a pixel area.

In an embodiment, an intermediate layer 220 including a light emission layer may be in the pixel area defined by the pixel defining layer 180. The intermediate layer 220 may be on the pixel electrode 210 having the wrinkled structure or rippled surface.

In an embodiment, the intermediate layer 220 may be formed using, for example, an inkjet printing method or a deposition method.

In an embodiment, an opposing electrode 230 facing the pixel electrode 210 may be formed on the flexible substrate 100. The opposing electrode 230, in this embodiment, may extend over the intermediate layer 220, and may extend over the entire surface of the flexible substrate 100.

Next, referring to the embodiment illustrated in FIG. 9, the tensile force applied to the flexible substrate 100, for example, in an x-axis direction or a y-axis direction, may be removed or no longer applied. The flexible substrate 100, which is then no longer under tensile force, may contract in a direction away from the direction in which the tensile force was applied, according to an embodiment. The arrows in the embodiment shown in FIG. 9 illustrates the contraction of the flexible substrate 100, to which the tensile force had been applied in the +x direction and the −x direction, in a direction opposite thereto, in −x direction and +x direction.

In this embodiment, a wrinkled structure or rippled surface is formed in the flexible substrate 100 after the tensile force is removed, and the pixel electrode 210 is formed on the flexible substrate 100. In FIG. 9, the wrinkled structure or rippled surface is only in the pixel electrode 210 corresponding with or complementing the flexible substrate 100, but the embodiments of the present invention are not limited thereto. In this embodiment, the wrinkled structure or rippled surface may also be in the intermediate layer 220 and the opposing electrode 230, at least partially.

In an embodiment, while the wrinkled structure or rippled surface of the flexible substrate 100 is illustrated as having wrinkles or ripples at regular intervals, the wrinkled structure or rippled surface of the flexible substrate 100 may also have wrinkles or ripples at substantially irregular intervals. A diameter or length of the wrinkles or ripples of the flexible substrate 100 may range in size from approximately dozens to approximately tens of micrometers.

In an embodiment, the wrinkled structures or ripples surfaces of the flexible substrate 100 and the pixel electrode 210 are irregularly formed because the wrinkled structures or ripples surfaces are formed through mechanical or physical deformation of the flexible substrate 100 rather than chemical patterning. In these embodiments, because the flexible substrate 100 is formed of an elastic polymer material, the wrinkled structure or rippled surface may be formed by applying a tensile force to the flexible substrate 100 and then removing the tensile force. In order to further form or define the wrinkled structure or rippled surface in the flexible substrate 100, an operation of contracting the flexible substrate 100 may also be applied after removing the tensile force. In this embodiment, where the wrinkled structure or rippled surface may be formed in the flexible substrate 100 and the pixel electrode 210 by using physical and mechanical methods, an additional mask or an additional patterning operation is not needed, and, thus, the manufacturing process may be simplified.

According to the method of manufacturing a flexible display apparatus as described above, wrinkled structures or rippled surfaces may physically and mechanically be formed in the flexible substrate 100 and the pixel electrode 210 on the flexible substrate 100 without using an additional mask or patterning operation, and, thus, the manufacturing process may be simplified. Also, a light extracting efficiency of the flexible display apparatus may be significantly increased by using the wrinkled structure or rippled surface of the pixel electrode 210.

As described above, according to the one or more of the above embodiments of the present invention, a flexible display apparatus having an improved light extracting efficiency and a method of manufacturing the flexible display apparatus may be provided. However, the embodiments of the present invention are not limited to these embodiments.

It should be understood that the embodiments described herein are descriptive only, and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made without departing from the spirit and scope of the present invention as defined by the application as a whole and further defined by the following claims.

What is claimed is:

1. A method of manufacturing a flexible display apparatus, the method comprising:
   applying a tensile force to a flexible substrate;
   forming a pixel electrode on the flexible substrate;
   removing the tensile force applied to the flexible substrate to form a rippled surface in the pixel electrode;
   forming an intermediate layer comprising a light emission layer on the pixel electrode; and
   forming an opposing electrode facing the pixel electrode.

2. The method of claim 1, wherein the removing of the tensile force comprises forming irregularly spaced ripples in the pixel electrode.

3. The method of claim 1, wherein the flexible substrate comprises an elastic material.

4. The method of claim 1, wherein the forming of the intermediate layer comprising the light emission layer comprises using a deposition method or a printing method.

5. A method of manufacturing a flexible display apparatus, the method comprising:
   applying a tensile force to a flexible substrate;
   forming a pixel electrode on the flexible substrate;
   forming an intermediate layer comprising a light emission layer on the pixel electrode;
   forming an opposing electrode facing the pixel electrode; and
   removing the tensile force applied to the flexible substrate to form a rippled surface in the pixel electrode.

6. The method of claim 5, wherein the removing of the tensile force comprises forming irregularly spaced ripples in the pixel electrode.

7. The method of claim 5, wherein the flexible substrate comprises an elastic material.

8. The method of claim 5, wherein the forming of the intermediate layer comprising the light emission layer comprises using a deposition method or a printing method.

* * * * *